United States Patent
Ke et al.

(10) Patent No.: US 11,115,177 B2
(45) Date of Patent: Sep. 7, 2021

(54) METHODS AND APPARATUS FOR PERFORMING CLOCK AND DATA DUTY CYCLE CORRECTION IN A HIGH-SPEED LINK

(71) Applicant: Intel Corporation, Santa Clara, CA (US)

(72) Inventors: Yanjing Ke, Union City, CA (US); Dinesh Patil, Sunnyvale, CA (US); Tim Tri Hoang, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 727 days.

(21) Appl. No.: 15/868,907

(22) Filed: Jan. 11, 2018

(65) Prior Publication Data

US 2019/0215146 A1   Jul. 11, 2019

(51) Int. Cl.
  *H04L 7/00* (2006.01)
  *H04L 7/04* (2006.01)
  *H03K 7/08* (2006.01)
  *H03K 5/156* (2006.01)

(52) U.S. Cl.
  CPC .......... *H04L 7/0091* (2013.01); *H03K 5/1565* (2013.01); *H03K 7/08* (2013.01); *H04L 7/042* (2013.01)

(58) Field of Classification Search
  CPC ..... H04L 7/0091; H04L 7/042; H03K 5/1565; H03K 7/08; H03M 9/00
  See application file for complete search history.

(56) References Cited

U.S. PATENT DOCUMENTS

| 8,294,502 | B2 | 10/2012 | Lewis |
| 8,462,906 | B1* | 6/2013 | Ding ................ H04L 7/00 375/355 |
| 8,476,947 | B2 | 7/2013 | Bui et al. |
| 8,519,763 | B2 | 8/2013 | Ravi et al. |
| 8,615,201 | B1 | 12/2013 | Li |
| 8,644,085 | B2 | 2/2014 | Kim et al. |
| 9,461,631 | B1 | 10/2016 | Oh et al. |
| 9,818,471 | B1 | 11/2017 | Oh et al. |
| 2006/0203939 | A1 | 9/2006 | Chou et al. |
| 2009/0177457 | A1* | 7/2009 | Dai ................... H03M 9/00 703/14 |
| 2019/0123728 | A1* | 4/2019 | Zhao ................. H04L 7/033 |
| 2019/0272804 | A1* | 9/2019 | Amirkhany ......... G09G 5/008 |

* cited by examiner

*Primary Examiner* — Vineeta S Panwalkar (57) ABSTRACT

An integrated circuit having a transmitter is provided. The transmitter may include a serializer, a driver, and an associated calibration circuit. The calibration circuit may include a detector and a control circuit. The control circuit may output a first control signal for selectively configuring the serializer to inject test data and may also output a second control signal for selectively inverting the input polarity of the detector. The control circuit may configure the transmitter in at least four different modes by adjusting the first and second control signals. In each of the four modes, the control circuit may sweep a clock duty cycle correction (DCC) setting that controls only the serializer until the detector flips. Codes generated in this way may be used to compute calibrated settings that mitigates both clock and data duty cycle distortion for the transmitted data.

18 Claims, 6 Drawing Sheets

| ctrl_1 | ctrl_2 | RECORDED CODE | AVERAGE CODE | clk_dcc setting | Data_dcc setting |
|---|---|---|---|---|---|
| '1010' pattern | Outp-Outn | CODE1 = DCD_clk + DCD_data - ofs | CODE5 = AVG (CODE1, CODE2) = DCD_clk + DCD_data | AVG(CODE5, CODE6) = DCD_clk | (CODE5 - CODE6)/2 = DCD_data |
| '1010' pattern | Outn-Outp | CODE2 = DCD_clk + DCD_data + ofs | | | |
| '0101' pattern | Outp-Outn | CODE3 = DCD_clk - DCD_data + ofs | CODE6 = AVG (CODE3, CODE4) = DCD_clk + DCD_data | | |
| '0101' pattern | Outn-Outp | CODE4 = DCD_clk - DCD_data - ofs | | | |

FIG. 6

METHODS AND APPARATUS FOR PERFORMING CLOCK AND DATA DUTY CYCLE CORRECTION IN A HIGH-SPEED LINK

BACKGROUND

This relates generally to communications links, and more particularly, to high-speed input-output (I/O) data communications links.

A typical communications link includes a transmitter, a receiver, and a channel that connects the transmitter to the receiver. The transmitter is configured to transmits a serial data bit stream across the channel to the receiver. Typical high-speed transmit data rates can be as high as 10 Gbps (gigabits per second) or more. Communications links operating at such high data rates are often referred to as high-speed serial links or high-speed I/O links.

The data output from the transmitter often suffers from duty cycle distortion (DCD). In a half-rate clocking system where the output data is triggered at both rising and falling clock edges of a transmitter clock signal, a non-ideal duty cycle of the transmitter clock signal (i.e., a duty cycle other than 50%) will cause the output data to be distorted. Even if the transmitter clock were to exhibit an ideal duty cycle of 50%, unbalanced rise and fall times in the transmitter data path can also cause the output data to be distorted.

In an effort to meet stringent DCD protocol requirements in high-speed data links, DCD correction schemes have been implemented in the transmitter design. Conventional duty cycle correction schemes, however, only correct DCD in the clock path (i.e., conventional correction algorithms only focus on fixing the duty cycle of the transmitter clock signal). The DCD in the data path, which is in an open loop path, is not corrected. The uncalibrated residual data DCD contributes deterministic jitter and degrades high-speed data link performance.

It is within this context that the embodiments described herein arise.

DETAILED DESCRIPTION

The present embodiments relate to integrated circuits and more particularly, to integrated circuits that include a high-speed link transmitter and an associated duty cycle distortion (DCD) calibration circuit that targets both clock and data DCD correction. The DCD calibration circuit may include a detector that monitors the transmit output data and that generates corresponding clock and data duty cycle correction (DCC) control signals. The clock and data DCC control signals are used to adjust the transmitter such that the final output data is also immune from the system offset of the detection circuit.

It will be recognized by one skilled in the art, that the present exemplary embodiments may be practiced without some or all of these specific details. In other instances, well-known operations have not been described in detail in order not to unnecessarily obscure the present embodiments.

Figure 1:
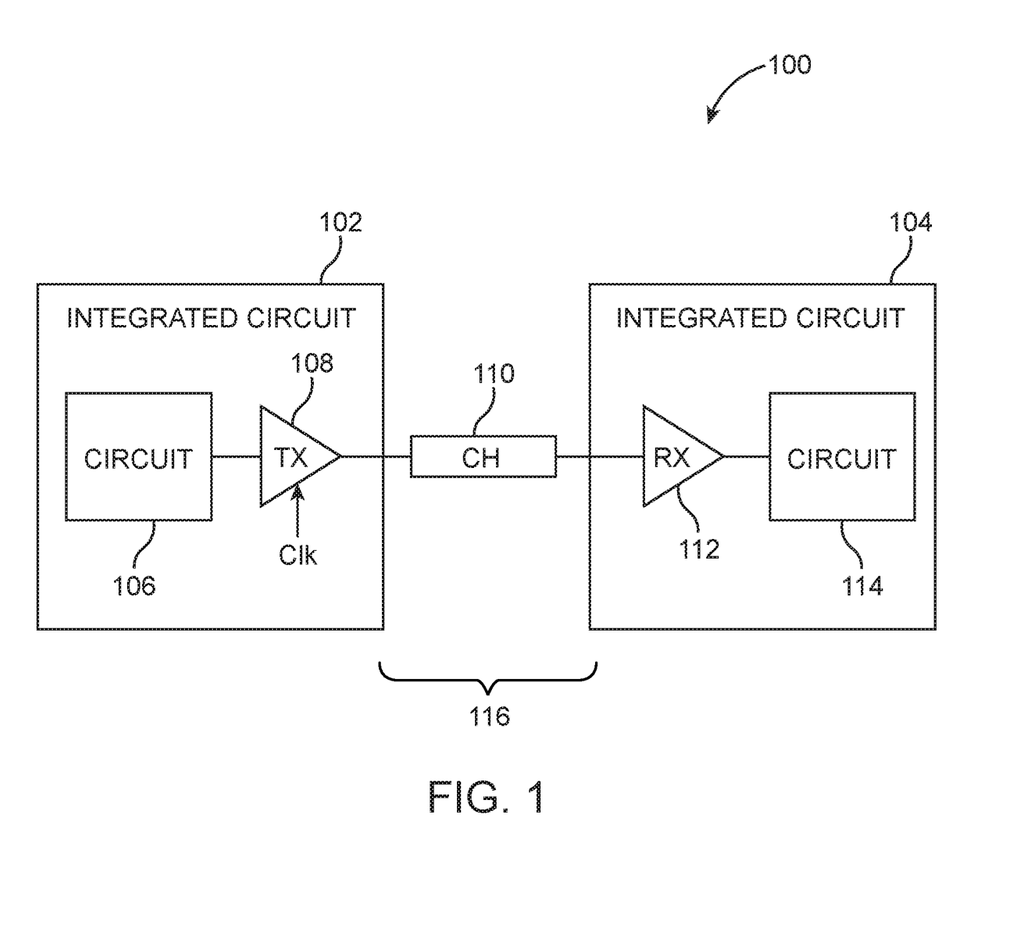
FIG. 1 is a diagram of an illustrative high-speed communications system in accordance with an embodiment.

FIG. 1 is a diagram of an illustrative high-speed communications system such as system 100. As shown in FIG. 1, system 100 may include components such as integrated circuits 102 and 104. Integrated circuits 102 and 104 may be, for example, application specific integrated circuits (ASICs), programmable integrated circuits such as programmable logic devices (PLDs) or other integrated circuits that contain programmable elements, memory circuits, digital signal processors, microprocessors, or any other suitable integrated circuits. Circuits 102 and 104 may be different types of integrated circuits. For example, circuit 102 may be a programmable logic device and circuit 104 may be an application-specific integrated circuit, or vice versa.

Devices 102 and 104 may contain circuitry such as core logic circuits 106 and 114. Circuits 106 and 114 may be, for example, digital logic circuits. Circuit 106 may produce data that is to be transmitted from integrated circuit 102 to integrated circuit 104 over link 116. Circuit 114 may consume data that has been received at the receiving end of link 116.

Transmitter 108 may be configured to transmit data from circuit 106 to receiver 112 over channel 110. Transmitter 108 may, for example, be implemented as part of integrated circuit 102. Receiver 112 may, as an example, be implemented as part of integrated circuit 104. Channel 110 may be formed from any suitable physical transmission medium. Examples of transmission paths that may be used in channel 110 include differential signaling paths made up of pairs of conductive wires, single conductive paths, coaxial cable paths and other transmission-line paths, paths on printed circuit boards, combinations of such paths, or other suitable communications link paths. In a typical system, integrated circuits 102 and 104 may be mounted on one or more circuit boards and channel 110 may involve transmission line structures fabricated on the circuit board or boards.

In the example of FIG. 1, integrated circuit 102 contains a single transmitter 108, and integrated circuit 104 contains a single corresponding receiver 112. A single channel 110 is used to connect transmitter 108 to receiver 112. This is merely illustrative. If desired, integrated circuit 102 may contain multiple transmitters such as transmitter 108, and integrated circuit 104 may contain multiple corresponding receivers such as receiver 112. Multiple communications paths may be used to link the various transmitters and receivers. Integrated circuit 102 may also include one or more receivers that receive data from one or more corresponding transmitters on integrated circuit 104. Data may also be conveyed to and from additional integrated circuits using transmitters and receivers such transmitter 108 and receiver 112.

Transmitter 108 may be configured to transmit a serial data bit stream across channel 110 to receiver 112. Typical high-speed transmit data rates can be as high as 10 Gbps (gigabits per second) or more. Communications links operating at such high data rates are sometimes referred to as high-speed serial links or high-speed input/output links. Transmitter 108 may be controlled by a transmit clock signal such as signal Clk. Transmitter 108 may generate output data at a rate that is proportional to signal Clk. Embodiments herein generally relate to a half-rate clocking scheme in which the output data toggles at both rising and falling clock edges of signal Clk. For example, a 10 Gbps serial data stream can be transmitted using a 5 GHz clock. As another example, a 50 Gbps serial bit stream can be transmitted using a 25 GHz clock signal.

In a half-rate clocking system, the output data generated by transmitter 108 often suffers from duty cycle distortion ("DCD"). There may be at least two different sources of DCD: a first type of DCD may be caused by clock duty cycle distortion (i.e., by a non-ideal clock signal with a duty cycle other than 50%), whereas a second type of DCD may be caused by data duty cycle distortion (i.e., by mismatched rise and fall times of the transmitter output driver).

Figure 2A:
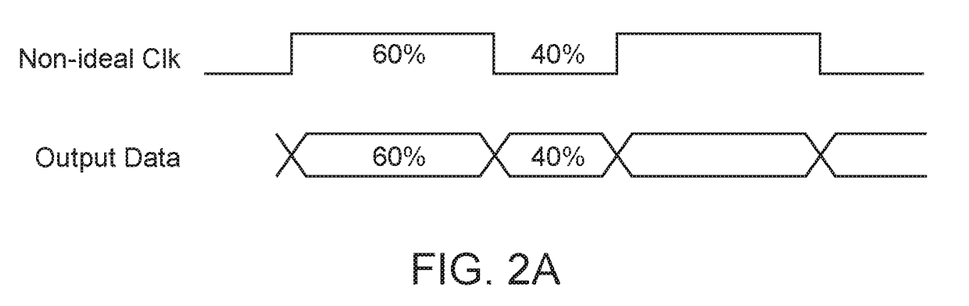
FIG. 2A is a diagram illustrating output data duty cycle distortion (DCD) caused by clock DCD.

FIG. 2A is a diagram illustrating output data DCD introduced by clock DCD. As shown in FIG. 2A, signal Clk may exhibit a non-ideal duty cycle of 60%. In other words, signal Clk is high 60% of the time and is low 40% of the time. As a result, the output data will toggle at uneven times (i.e., the output data stream will exhibit a wide eye opening for data bits corresponding to the high clock phase and will exhibit a small eye opening for data bits corresponding to the low clock phase). Output data distorted in this way may substantially limit the performance of high-speed communications links.

Figure 2B:
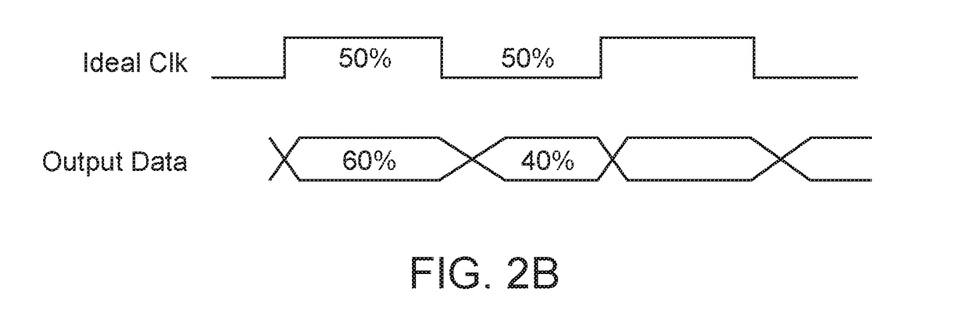
FIG. 2B is a diagram illustrating output data duty cycle distortion (DCD) caused by mismatched rise time and fall time.

FIG. 2B is a diagram illustrating output data DCD caused by mismatched rise and fall times. As shown in FIG. 2B, signal Clk may exhibit an ideal duty cycle of 50%; however, the output data may exhibit a fast rise time and a relatively slow fall time (i.e., data triggered by rising edges of Clk changes quickly, whereas data triggered by falling edges of Clk changes slowly). As a result, the output data will also toggle at uneven times (i.e., the output data stream will exhibit a wide eye opening for data bits corresponding to the high clock phase and will exhibit a small eye opening for data bits corresponding to the low clock phase). Output data distorted in this way can also substantially limit the performance of high-speed communications links.

Figure 3:
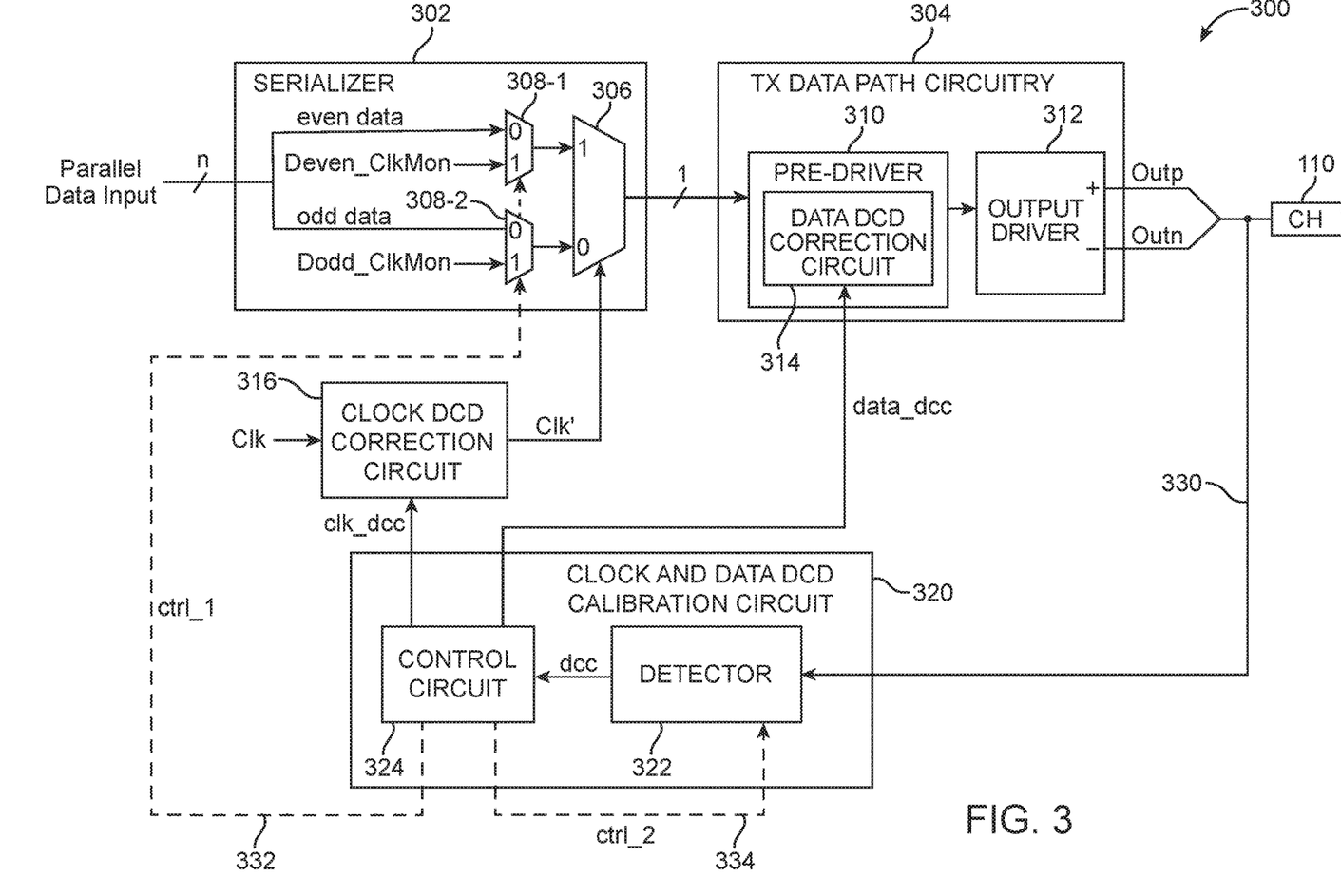
FIG. 3 is a diagram of illustrative transmitter circuitry that includes a clock and data duty cycle distortion calibration circuit in accordance with an embodiment.

In accordance with an embodiment, an integrated circuit may be provided with transmitter circuitry having a clock and data duty cycle distortion calibration circuit configured to mitigate both clock DCD and data DCD to improve the performance of a high-speed data link (see, e.g., transmitter circuitry 300 in FIG. 3). As shown in FIG. 3, transmitter circuitry 300 may include a data serializer circuit such as serializer 302, transmit data path circuitry 304, a clock DCD correction circuit such as circuit 316, and clock and data DCD calibration circuit such as circuit 320. Serializer 302 and circuitry 304 may be considered part of transmitter 108 in FIG. 1.

Serializer 302 may be configured to receive a parallel data input (e.g., serializer 302 may receive n parallel data bits) and to generate a serial output that is fed to transmit data path circuitry 304 (e.g., serializer 302 may generate a 1-bit wide serial data stream at its output).

Serializer 302 may include an output multiplexer 306, a first input multiplexer 308-1, and a second input multiplexer 308-2. Output multiplexer 306 may have a first("1") input configured to receive signals from multiplexer 308-1, a second("0") input configured to receive signals from multiplexer 308-2, and an output terminal that serves as the output port of serializer 302. Output multiplexer 306 may also have a control input that receives signal Clk' from clock DCD correction circuit 316. Circuit 316 receives a raw clock signal Clk from a clock source (e.g., an on-chip clock source such as a phase-locked loop or an off-chip clock source such as a crystal oscillator) and outputs a DCD-corrected clock signal Clk'. The amount by which circuit 316 corrects the clock signal may be adjusted by clock duty cycle correction control signal clk_dcc. Signal clk_dcc is generated by calibration circuit 320 and is used to correct any clock DCD so that signal Clk' exhibits a desired duty cycle.

Signals received at the first input of multiplexer 306 may be referred to as "even" data and are passed through to the output of serializer 302 at the high clock phases of signal Clk'. Signals received at the second input of multiplexer 306 may be referred to as "odd" data and are passed through to the output of serializer 302 at the low clock phases of signal Clk'.

Multiplexers 308-1 and 308-2 are configured to provide a clock monitoring function for transmitter circuitry 300. Multiplexer 308-1 has a first("0") input that receives even data from the parallel input of serializer 302 and a second ("1") input that receives an even clock monitoring data Deven_ClkMon. Similarly, multiplexer 308-2 has a first ("0") input that receives odd data from the parallel input of serializer 302 and a second("1") input that receives an odd clock monitoring data Dodd_ClkMon. Multiplexers 308-1 and 308-2 each have a control input that receives control signal ctrl_1 from calibration circuit 320 via path 332.

During normal operation, signal ctrl_1 is driven low so that even and odd data from the parallel data input is routed through to output multiplexer 306. During calibration operations, however, signal ctrl_0 may be driven high such that calibration data bits Deven_ClkMon and Dodd_ClkMon may be routed through to output multiplexer 306 (i.e., the clock monitoring data bits are injected into serializer 302 while the parallel data input is switched out of use and bypassed). Clock monitoring data bits Deven_ClkMon and Dodd_ClkMon may be set to logic "1" or "0" depending on the calibration algorithm, which will be discussed in detail below.

Transmit data path circuitry 304 may include a pre-driver circuit 310 and an output driver 312. Pre-driver 310 may include a data duty cycle distortion (DCD) correction circuit 314 that is adjusted by data duty cycle correction control signal data_dcc. Signal data_dcc is generated by calibration circuit 320 and is used to correct any data DCD in the transmit path such that the rise and fall times at the final output of transmitter circuitry 300 are substantially matching (e.g., the rise times and fall times of the output data are within 1% of each other, within 5% of each other, within 10% of each other, etc.).

Output driver 312 may receive corrected signal from pre-driver 310. In the example of FIG. 3, output driver 312 may be a differential output driver circuit such that driver 312 has a first (positive) differential output terminal Outp and a second (negative) differential output terminal Outn. The actual value of the differential output signal is equal to Outp minus Outn. The differential output of output driver 312 directly drives channel 110 of the high-speed link. This example in which output driver 312 has a differential output port is merely illustrative. If desired, circuitry 304 may have a single-ended output port.

Still referring to FIG. 3, clock and data DCD calibration circuit 320 may include a detector circuit such as detector 322 and an associated control circuit 324. Calibration circuit 320 may tap the transmit data path at only a single tap point, which is at the differential output port of circuitry 304. Detector 322 need not tap clock signal Clk' (i.e., detector 322 neither directly receives nor directly monitors signal Clk'). Configured in this way, detector 322 may be configured to receive and monitor the differential output data, as indicated by feedback path 330. Depending on the value of the output data, detector 322 may generate a corresponding duty cycle correction output dcc.

Control circuit 324 may receive output signal dcc from detector 322. In particular, control circuit 324 may be configured to place transmitter circuitry 300 in various modes during DCC calibration operations by adjusting control signals ctrl_1 and ctrl_2. Control signal ctrl_1 on path 332 may be adjusted to selectively place serializer 302 in clock monitoring mode (e.g., signal ctrl_1 may be asserted or driven high so that signals Deven_ClkMon and Dodd_ClkMon can be injected into the transmit data path). Signal ctrl_2 on path 334 may be adjusted to control the input polarity of detector 322, the specifics of which are described in connection with FIG. 4 below. Control circuit 324 may also generate clock DCC settings clk_dcc to control circuit 316 (i.e., to adjust the duty cycle of signal Clk') and data DCC settings data_dcc to adjust a data DCD correction circuit 314 that resides within pre-driver 310 (i.e., to selectively adjust the rise and fall times of driver 310).

Control circuit 324 may monitor the value of signal dcc while adjusting control signals ctrl_1 and ctrl_2, DCC settings clk_dcc, and/or data_dcc to place transmitter circuitry 300 in different modes of operation. Based on the values of signal dcc during each of the different modes of operation, control circuit 324 may compute suitable calibration settings clk_dcc and data_dcc that minimize both the amount of clock DCD and data DCD for the output data to be transmitted through channel 110.

Figure 4:
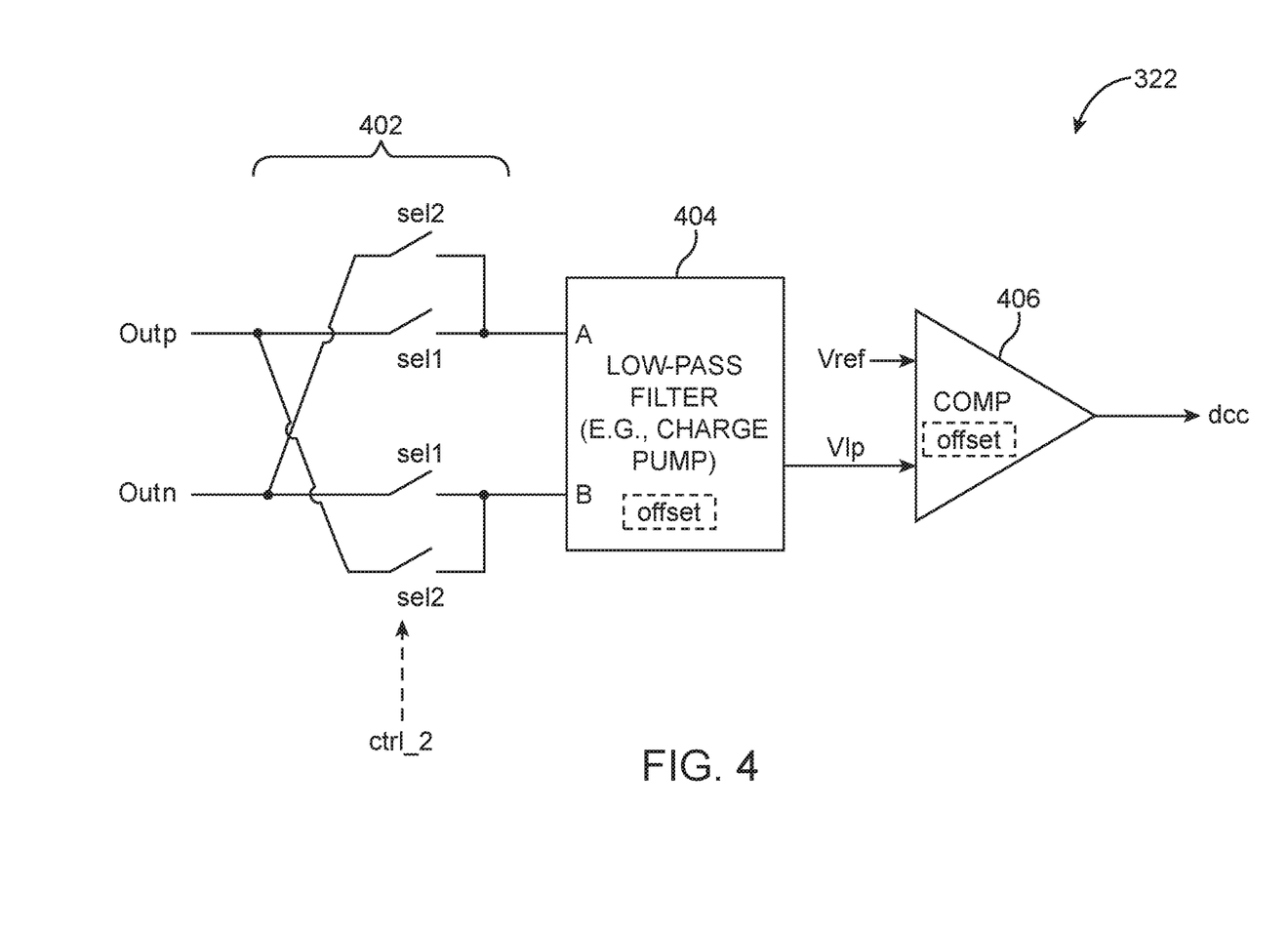
FIG. 4 is a diagram of an illustrative detector circuit that can be part of the clock and data duty cycle distortion calibration circuit shown in FIG. 3 in accordance with an embodiment.

FIG. 4 is a diagram illustrating one suitable circuit implementation of detector 322. As shown in FIG. 4, detector 322 may include an input polarity switching circuit such as a polarity multiplexer 402, a filter circuit such as low-pass filter 404, and a comparison circuit such as comparator 406. Polarity multiplexer 402 may have a first input terminal that is coupled to positive differential output terminal Outp, a second input terminal that is coupled to negative differential output terminal Outn, a first output terminal, a second output terminal, a first "sel1" switch coupled between the first input terminal and the first output terminal, a second "sel1" switch coupled between the second output terminal and the second output terminal, a first "sel2" switch coupled between the second input terminal and the first output terminal, and a second "sel2" switch coupled between the first input terminal and the second output terminal.

Configured in this arrangement, the sel1 switches may be turned on while the sel2 switches are turned off when control signal ctrl_2 has a first value. When control signal ctrl_2 has a second value that is different than the first value, the sel2 switches may be turned on while the sel1 switches are turned off. In other words, control signal ctrl_2 either passes the value of (Outp minus Outn) to low-pass filter 404 by only turning on the sel1 switches or passes the value of (Outn minus Outp) to low-pass filter 404 by only turning on the sel2 switches (i.e., multiplexer 402 selectively inverts the input polarity of detector 322).

Low-pass filter 404 has a first input A connected to the first output terminal of multiplexer 402, a second input B connected to the second output terminal of multiplexer 402, and an output on which a corresponding low-pass filtered signal Vlp is generated. As an example, low-pass filter 404 may be a charge pump having an offset. If filter 404 is a charge pump, it will charge up signal Vlp whenever input A is greater than input B or will discharge signal Vlp whenever input B is greater than input A.

Comparator 406 have a first input that receives a fixed reference signal Vref, a second input that receives signal Vlp from low-pass filter 404, and an output on which signal dcc is generated. As an example, comparator 406 may drive signal dcc low in response to signal Vlp exceeding signal Vref and may drive signal dcc high in response to signal Vlp falling below signal Vref. As another example, comparator 406 may drive signal dcc high in response to signal Vlp exceeding signal Vref and may drive signal dcc low in response to signal Vlp falling below signal Vref. Comparator 406 may also have an offset that affects the accuracy of detector 322. In other words, comparator 406 will toggle signal dcc whenever signal Vlp crosses the predetermined Vref threshold level.

Figure 5:
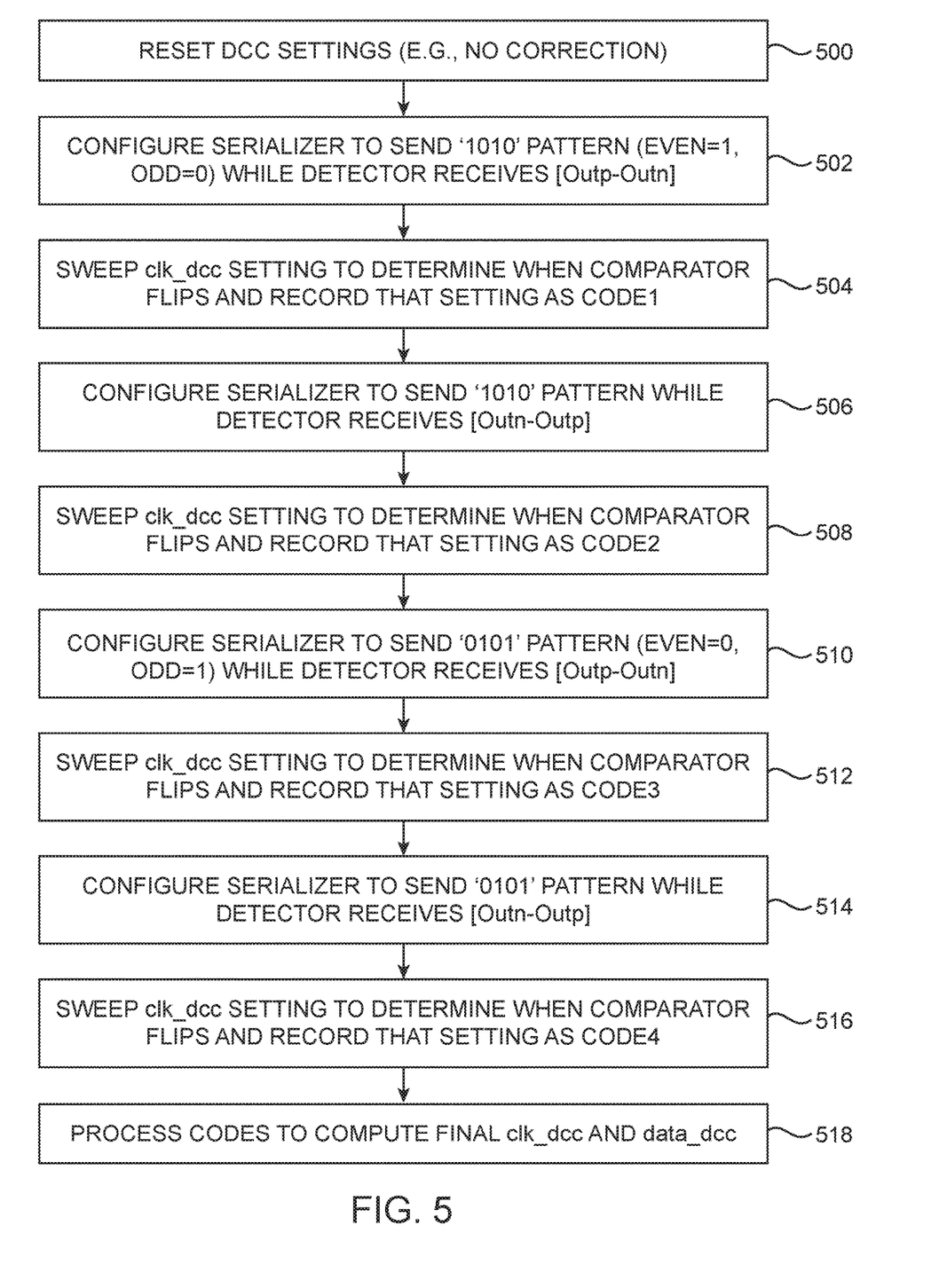
FIG. 5 is a flow chart of illustrative steps for operating transmitter circuitry of the type shown in connection with FIG. 3 in accordance with an embodiment.

FIG. 5 is a flow chart of illustrative steps for using transmitter circuitry 300 to perform DCD calibration operations. At step 500, all duty cycle correction (DCC) settings may be reset such that no correction is applied (i.e., clock DCC control signal clk_dcc and data DCC control signal data_dcc may be reset to their default values).

At step 502, calibration circuit 320 may configure serializer 302 to send a predetermined '1010' alternating bit pattern while detector 322 receives (Outp minus Outn). To send the '1010' repeating test pattern, Deven_ClkMon is set to '1' while Dodd_ClkMon is set to '0', and signal ctrl_1 may be asserted or driven high to inject the test bits. In order for detector 322 to receive (Outp minus Outn), control circuit 324 may adjust signal ctrl_2 such that only the sel1 switches are turned on (see, e.g., FIG. 4).

At step 504, control circuit 324 may sweep the clk_dcc setting and determine when comparator 406 flips (i.e., control circuit 324 may determine the particular clk_dcc setting that causes signal dcc to toggle from low to high or from high to low). Control circuit 324 may then record this triggering clk_dcc setting as a first code ("CODE1"). Note that while clk_dcc is adjusted, the data_dcc setting remains fixed at the default value.

At step 506, calibration circuit 320 may configure serializer 302 to send the predetermined '1010' alternating calibration pattern while detector 322 receives (Outn minus Outp). To send the '1010' repeating test pattern, Deven_ClkMon is set to '1' while Dodd_ClkMon is set to '0', and signal ctrl_1 may be asserted or driven high to inject the test bits. In order for detector 322 to receive (Outn minus Outp), control circuit 324 may adjust signal ctrl_2 to invert the input polarity of multiplexer 402 such that only the sel2 switches are turned on.

At step 508, control circuit 324 may sweep the clk_dcc setting to determine when comparator 406 flips and record this triggering clk_dcc setting as a second code ("CODE2"). Note that while clk_dcc is adjusted, the data_dcc setting remains fixed at the default value.

At step 510, calibration circuit 320 may configure serializer 302 to send a predetermined '0101' alternating calibration/test pattern while detector 322 receives (Outp minus Outn). To send the '0101' repeating test pattern, Deven_ClkMon is now set to '0' while Dodd_ClkMon is set to '1', and signal ctrl_1 is asserted to inject the test bits. In order for detector 322 to receive (Outp minus Outn), control circuit 324 may adjust signal ctrl_2 to revert the input polarity of multiplexer 402 such that only the sel1 switches are turned on.

At step 512, control circuit 324 may sweep the clk_dcc setting and determine when comparator 406 flips and record this triggering clk_dcc setting as a third code ("CODE3"). Note that while clk_dcc is adjusted, the data_dcc setting remains fixed at the default value.

At step 514, calibration circuit 320 may configure serializer 302 to inject the predetermined '0101' alternating data pattern while detector 322 receives (Outn minus Outp). To send the '0101' repeating test pattern, Deven_ClkMon is set to '0' while Dodd_ClkMon is set to '1', and signal ctrl_1 is asserted to inject the test bits. In order for detector 322 to receive (Outn minus Outp), control circuit 324 may adjust signal ctrl_2 to again invert the input polarity of multiplexer 402 such that only the sel2 switches are turned on.

At step 516, control circuit 324 may sweep the clk_dcc setting and determine when comparator 406 flips and record this triggering clk_dcc setting as a fourth code ("CODE4"). Note that while clk_dcc is adjusted, the data_dcc setting remains fixed at the default value.

Figure 6:
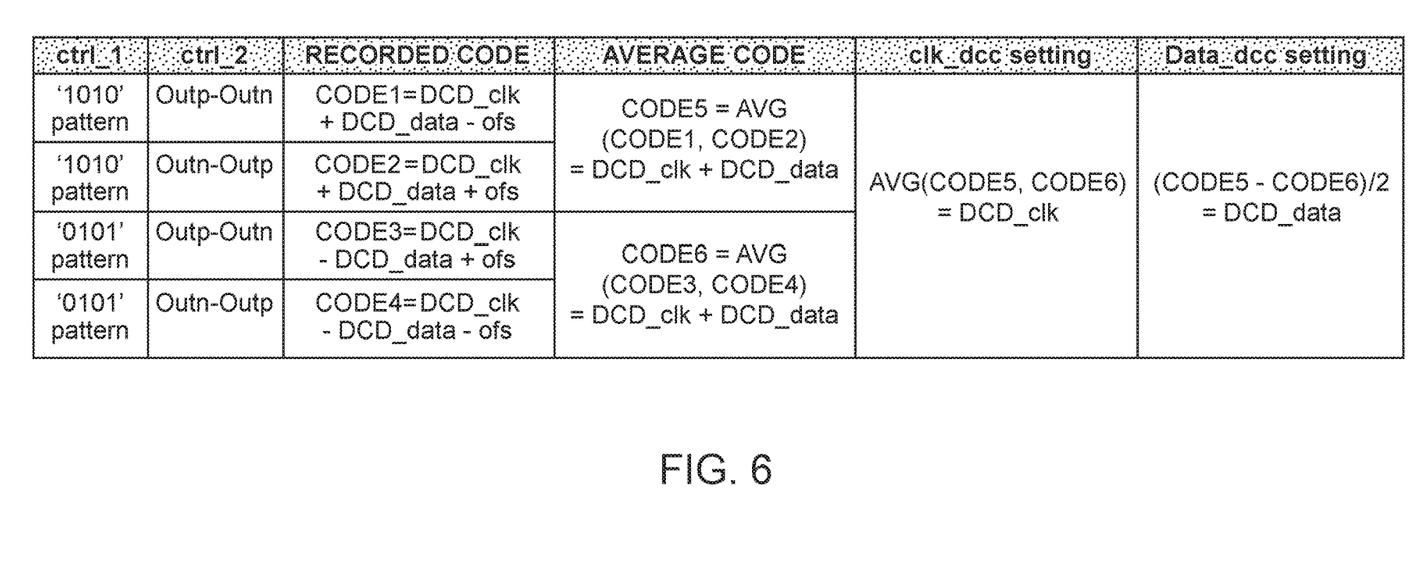
FIG. 6 is a table showing illustrative computations that can be performed using the clock and data duty cycle distortion calibration circuit of FIG. 3 in accordance with an embodiment.

At step 518, control circuit 324 may process the recorded codes (i.e., CODE1, CODE2, CODE3, and CODE4) to compute the final calibrated settings for clk_dcc and data_dcc. FIG. 6 is a table showing illustrative computations performed using calibration circuit 320 (FIG. 3). As shown in FIG. 6, CODE1 captures the sum of clock DCD and data DCD minus the offset of detector 322 (i.e., the offset associated with low-pass filter 404 and/or comparator 406), as indicated in the third column in FIG. 6. Relative to CODE1, CODE2 flips the input polarity of the detector and therefore captures the sum of clock DCD, data DCD, and the detector offset. Thus, if there is no detector offset, CODE1 and CODE2 may be identical.

Relative to CODE1, CODE3 flips the repeating test pattern and therefore captures the sum of clock DCD and detector offset minus data DCD. As a result, the average of CODE1 and CODE3 may be equal to the clock DCD. Relative to CODE3, CODE4 flips the input polarity of the detector and therefore captures clock DCD minus data DCD and minus the detector offset. Thus, if there is no detector offset, CODE3 and CODE4 may be identical. If the detector offset is non-zero, the average of CODE1 and CODE3 may be equal to the offset for the normal input polarity of the detector. If the detector offset is non-zero, the average of CODE2 and CODE4 may be equal to the offset for the inverted input polarity of the detector.

Control circuit 324 may further compute additional codes via an averaging function. Control circuit 324 may compute a fifth code ("CODE5") by computing the average of CODE1 and CODE2. The average of CODE1 and CODE3 is equal to the sum of clock DCD and data DCD, as indicated in the fourth column of FIG. 6. Control circuit 324 may further compute a sixth code ("CODE6") by computing the average of CODE3 and CODE4. The average of CODE3 and CODE4 is equal clock DCD minus data DCD.

After CODE5 and CODE6 have been computed, control circuit 324 may compute the final calibrated clock DCC setting (clk_dcc) by taking the average of CODE5 and CODE6, as indicated by the fifth column in FIG. 6. Control circuit 324 may also compute the final calibrated data DCC setting (data_dcc) by subtracting CODE6 from CODE5 and halving the corresponding difference, as indicated by the sixth column in FIG. 6. This marks the end of the DCD calibration. During normal operation of transmitter circuitry 300, control circuit 324 may supply the calibrated clk_dcc and data_dcc settings to control serializer 302 and transmit data path circuitry 304, respectively. Configured as such, transmitter circuitry 304 calibrated in this way will be free of both clock DCD and data DCD while also mitigating any detector offset, which will improve the performance of the high-speed communications link.

These steps are merely illustrative and are not intended to limit the present embodiments. At least some of the existing steps may be modified or omitted; some of the steps may be performed in parallel; additional steps may be added or inserted; and the order of certain steps may be reversed or altered.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

EXAMPLES

The following examples pertain to further embodiments.

Example 1 is an integrated circuit, comprising: a serializer circuit configured to receive a clock signal; transmit data path circuitry configured to receive data signals from the serializer circuit and to generate corresponding output data; and a duty cycle distortion calibration circuit configured to receive only the output data from the transmit data path circuitry and to generate calibrated settings, wherein the calibrated settings mitigate clock duty cycle distortion in the output data by controlling the clock signal, and wherein the calibrated settings mitigate data duty cycle distortion in the output data by controlling the transmitter data path circuitry.

Example 2 is the integrated circuit of example 1, optionally further comprising a clock duty cycle distortion correction circuit configured to output the clock signal to the serializer and that is controlled by the duty cycle calibration circuit.

Example 3 is the integrated circuit of example 2, wherein the duty cycle distortion calibration circuit optionally comprises: a detector circuit configured to receive only the output data from the transmit data path circuitry; and a control circuit configured to generate the calibrated settings, wherein the control circuit is further configured to generate a first control signal that controls the serializer circuit and to generate a second control signal that controls the detector circuit.

Example 4 is the integrated circuit of example 3, wherein the detector circuit optionally comprises: an input polarity multiplexer; a low-pass filter configured to receive signals from the input polarity multiplexer; and a comparator configured to compare signals received from the low-pass filter with a reference signal.

Example 5 is the integrated circuit of example 4, wherein the low-pass filter optionally comprises a charge pump circuit.

Example 6 is the integrated circuit of example 4, wherein the second control signal optionally selectively inverts an input polarity of the input polarity multiplexer.

Example 7 is the integrated circuit of example 4, wherein the first control signal optionally configures the serializer circuit to selectively pass through calibration data bits to the transmit data path circuitry.

Example 8 is the integrated circuit of any one of examples 4-7, wherein the control circuit is optionally configured to generate the calibrated settings by generating a clock duty cycle correction signal and a data duty cycle correction signal, wherein the clock duty cycle correction signal optionally controls the clock duty cycle distortion correction circuit, and wherein the data duty cycle correction signal optionally controls a pre-driver circuit in the transmit data path circuitry.

Example 9 is the integrated circuit of example 8, wherein the control circuit is optionally configured to compute first and second codes using an average function.

Example 10 is the integrated circuit of example 9, wherein the control circuit is optionally further configured to generate the clock duty cycle correction signal by averaging the first and second codes, and wherein the control circuit is optionally further configured to generate the data duty cycle correction signal by computing the difference between the first and second codes.

Example 11 is a method of operating an integrated circuit, the method comprising: with a serializer in the integrated circuit, receiving a clock signal; with transmit data path circuitry in the integrated circuit, receiving data signals from the serializer and generating corresponding output data; with a calibration circuit in the integrated circuit, receiving the output data from the transmit data path circuitry; with the calibration circuit, generating a clock duty cycle correction signal that mitigates clock duty cycle distortion in the output data; and with the calibration circuit, generating a data duty cycle correction signal that mitigates data duty cycle distortion in the output data, wherein the data duty cycle correction signal is different than the clock duty cycle correction signal.

Example 12 is the method of example 11, optionally further comprising: with the calibration circuit, configuring the serializer to send a first test pattern to the transmit data path circuitry; and while the serializer is sending the first test pattern, sweeping only the clock duty cycle correction signal but not the data duty cycle correction signal until a comparator within the calibration circuit flips to determine a first code.

Example 13 is the method of example 12, optionally further comprising: with the calibration circuit, inverting an input polarity of the calibration circuit; and while the serializer is sending the first test pattern and while the input polarity of the calibration circuit is inverted, sweeping only the clock duty cycle correction signal but not the data duty cycle correction signal until the comparator flips to determine a second code.

Example 14 is the method of example 13, optionally further comprising: with the calibration circuit, configuring the serializer to send a second test pattern to the transmit data path circuitry, wherein the second test pattern is different than the first test pattern; while the serializer is sending the second test pattern, sweeping only the clock duty cycle correction signal but not the data duty cycle correction signal until the comparator flips to determine a third code; with the calibration circuit, inverting the input polarity of the calibration circuit; and while the serializer is sending the second test pattern and while the input polarity of the calibration circuit is inverted, sweeping only the clock duty cycle correction signal but not the data duty cycle correction signal until the comparator flips to determine a fourth code.

Example 15 is the method of example 14, optionally further comprising: computing a fifth code by averaging the first and second codes; and computing a sixth code by averaging the third and fourth code, wherein: generating the clock duty cycle correction signal comprises averaging the fifth and sixth codes; and generating the data duty cycle correction signal comprises subtracting the sixth code from the fifth code and halving the resulting difference.

Example 16 is transmit circuitry, comprising: a serializer circuit; a pre-driver circuit configured to receive signals from the serializer circuit; an output driver configured to receive signals from the pre-driver circuit; a clock duty cycle correction circuit configured to output a clock signal to the serializer circuit; and a calibration circuit configured to receive output signals from the output driver and to generate a clock duty cycle correction signal that controls the clock duty cycle correction circuit and a data duty cycle correction signal that controls the pre-driver circuit.

Example 17 is the transmit circuitry of example 16, wherein the calibration circuit optionally comprises: a detector; and a control circuit configured to receive signals from the detector and to generate the clock duty cycle correction signal and the data duty cycle correction signal.

Example 18 is the transmit circuitry of example 17, wherein the detector optionally comprises: an input polarity multiplexer; a low-pass filter configured to receive signals from the input polarity multiplexer; and a comparator configured to receive signals from the low-pass filter.

Example 19 is the transmit circuitry of example 18, wherein the control circuit is optionally further configured to generate a control signal that selectively inverts the polarity of the input polarity multiplexer.

Example 20 is the transmit circuitry of any one of examples 17-19, wherein the serializer circuit optionally comprises: a first input multiplexer; a second input multiplexer; and an output multiplexer configured to receive signals from the first and second input multiplexers, wherein the output multiplexer is controlled by the clock signal, and wherein the control circuit is further configured to generate a control signal that controls the first and second input multiplexers.

Example 21 is an integrated circuit, comprising: first means for receiving a clock signal; second means for receiving data signals from the first means and generating corresponding output data; and third means for receiving the output data from the second means, generating a clock duty cycle correction signal that mitigates clock duty cycle distortion in the output data, and generating a data duty cycle correction signal that mitigates data duty cycle distortion in the output data, wherein the data duty cycle correction signal is different than the clock duty cycle correction signal.

Example 22 is the integrated circuit of example 21, wherein the third means optionally configures the first means to send a first test pattern to the second means, and wherein the third means is optionally configured to sweep only the clock duty cycle correction signal but not the data duty cycle correction signal until a comparator within the third means flips to determine a first code while the first means is sending the first test pattern.

Example 23 is the integrated circuit of example 22, wherein the third means is optionally further configured to invert an input polarity of the third means, and wherein the third means is optionally configured to sweep only the clock duty cycle correction signal but not the data duty cycle correction signal until the comparator flips to determine a second code while the first means is sending the first test pattern and while the input polarity of the third means is inverted.

Example 24 is the integrated circuit of example 23, wherein the third means further optionally configures the first means to send a second test pattern to the second means, wherein the second test pattern is different than the first test pattern, wherein the third means is optionally configured to sweep only the clock duty cycle correction signal but not the data duty cycle correction signal until the comparator flips to determine a third code while the first means is sending the second test pattern, and wherein the third means is optionally configured to sweep only the clock duty cycle correction signal but not the data duty cycle correction signal until the comparator flips to determine a fourth code while the first means is sending the second test pattern and while the input polarity of the third means is inverted.

Example 25 is the integrated circuit of example 24, wherein the third means is optionally further configured to compute a fifth code by averaging the first and second codes and to compute a sixth code by averaging the third and fourth code, and wherein the third means optionally generates the clock duty cycle correction signal by averaging the fifth and sixth codes and generates the data duty cycle correction signal by subtracting the sixth code from the fifth code and halving the resulting difference.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
    a serializer circuit configured to receive a clock signal;
    transmit data path circuitry configured to receive data signals from the serializer circuit and to generate corresponding output data; and
    a duty cycle distortion calibration circuit configured to receive only the output data from the transmit data path circuitry and to generate calibrated settings, wherein the calibrated settings mitigate clock duty cycle distortion in the output data by controlling the clock signal, and wherein the calibrated settings mitigate data duty cycle distortion in the output data by controlling the transmitter data path circuitry.

2. The integrated circuit of claim 1, further comprising a clock duty cycle distortion correction circuit configured to output the clock signal to the serializer circuit and that is controlled by the duty cycle distortion calibration circuit.

3. The integrated circuit of claim 2, wherein the duty cycle distortion calibration circuit comprises:
    a detector circuit configured to receive only the output data from the transmit data path circuitry; and
    a control circuit configured to generate the calibrated settings, wherein the control circuit is further configured to generate a first control signal that controls the serializer circuit and to generate a second control signal that controls the detector circuit.

4. The integrated circuit of claim 3, wherein the detector circuit comprises:
    an input polarity multiplexer;
    a low-pass filter configured to receive signals from the input polarity multiplexer; and
    a comparator configured to compare signals received from the low-pass filter with a reference signal.

5. The integrated circuit of claim 4, wherein the low-pass filter comprises a charge pump circuit.

6. The integrated circuit of claim 4, wherein the second control signal selectively inverts an input polarity of the input polarity multiplexer.

7. The integrated circuit of claim 4, wherein the first control signal configures the serializer circuit to selectively pass through calibration data bits to the transmit data path circuitry.

8. The integrated circuit of claim 4, wherein the control circuit is configured to generate the calibrated settings by generating a clock duty cycle correction signal and a data duty cycle correction signal, wherein the clock duty cycle correction signal controls the clock duty cycle distortion correction circuit, and wherein the data duty cycle correction signal controls a pre-driver circuit in the transmit data path circuitry.

9. The integrated circuit of claim 8, wherein the control circuit is configured to compute first and second codes using an average function.

10. The integrated circuit of claim 9, wherein the control circuit is further configured to generate the clock duty cycle correction signal by averaging the first and second codes, and wherein the control circuit is further configured to generate the data duty cycle correction signal by computing the difference between the first and second codes.

11. A method of operating an integrated circuit, the method comprising:
    with a serializer in the integrated circuit, receiving a clock signal;
    with transmit data path circuitry in the integrated circuit, receiving data signals from the serializer and generating corresponding output data;
    with a calibration circuit in the integrated circuit, receiving the output data from the transmit data path circuitry;
    with the calibration circuit, generating a clock duty cycle correction signal that mitigates clock duty cycle distortion in the output data;
    with the calibration circuit, generating a data duty cycle correction signal that mitigates data duty cycle distortion in the output data, wherein the data duty cycle correction signal is different than the clock duty cycle correction signal;
    with the calibration circuit, configuring the serializer to send a first test pattern to the transmit data path circuitry; and
    while the serializer is sending the first test pattern, sweeping only the clock duty cycle correction signal but not the data duty cycle correction signal until a comparator within the calibration circuit flips to determine a first code.

12. The method of claim 11, further comprising:
    with the calibration circuit, inverting an input polarity of the calibration circuit; and
    while the serializer is sending the first test pattern and while the input polarity of the calibration circuit is inverted, sweeping only the clock duty cycle correction signal but not the data duty cycle correction signal until the comparator flips to determine a second code.

13. The method of claim 12, further comprising:
    with the calibration circuit, configuring the serializer to send a second test pattern to the transmit data path circuitry, wherein the second test pattern is different than the first test pattern;
    while the serializer is sending the second test pattern, sweeping only the clock duty cycle correction signal but not the data duty cycle correction signal until the comparator flips to determine a third code;

with the calibration circuit, inverting the input polarity of the calibration circuit; and while the serializer is sending the second test pattern and while the input polarity of the calibration circuit is inverted, sweeping only the clock duty cycle correction signal but not the data duty cycle correction signal until the comparator flips to determine a fourth code.

14. The method of claim 13, further comprising:

computing a fifth code by averaging the first and second codes; and computing a sixth code by averaging the third and fourth codes, wherein:

generating the clock duty cycle correction signal comprises averaging the fifth and sixth codes; and generating the data duty cycle correction signal comprises subtracting the sixth code from the fifth code and halving the resulting difference.

15. Transmit circuitry, comprising:

a serializer circuit;

a pre-driver circuit configured to receive signals from the serializer circuit;

an output driver configured to receive signals from the pre-driver circuit;

a clock duty cycle correction circuit configured to output a clock signal to the serializer circuit; and a calibration circuit configured to receive output signals from the output driver and to generate a clock duty cycle correction signal that controls the clock duty cycle correction circuit and a data duty cycle correction signal that controls the pre-driver circuit, wherein the calibration circuit comprises a detector and a control circuit, wherein the detector comprises an input polarity multiplexer, and wherein the control circuit is configured to generate a control signal that selectively inverts a polarity of the input polarity multiplexer.

16. The transmit circuitry of claim 15, wherein the control circuit is further configured to receive signals from the detector and to generate the clock duty cycle correction signal and the data duty cycle correction signal.

17. The transmit circuitry of claim 16, wherein the detector further comprises:

a low-pass filter configured to receive signals from the input polarity multiplexer; and a comparator configured to receive signals from the low-pass filter.

18. The transmit circuitry of claim 16, wherein the serializer circuit comprises:

a first input multiplexer;

a second input multiplexer; and an output multiplexer configured to receive signals from the first and second input multiplexers, wherein the output multiplexer is controlled by the clock signal, and wherein the control circuit is further configured to generate an additional control signal that controls the first and second input multiplexers.

* * * * *